United States Patent
Kawashima (10) Patent No.: US 8,043,940 B2
(45) Date of Patent: Oct. 25, 2011

(54) METHOD FOR MANUFACTURING SEMICONDUCTOR CHIP AND SEMICONDUCTOR DEVICE

(75) Inventor: Yoshitsugu Kawashima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 70 days.

(21) Appl. No.: 12/457,035

(22) Filed: May 29, 2009

(65) Prior Publication Data

US 2009/0294913 A1    Dec. 3, 2009

(30) Foreign Application Priority Data

Jun. 2, 2008   (JP) .................. 2008-145164

(51) Int. Cl.
- H01L 21/00 (2006.01)
- H01L 21/336 (2006.01)
- H01L 21/46 (2006.01)
- H01L 21/78 (2006.01)
- H01L 21/301 (2006.01)

(52) U.S. Cl. .......... 438/460; 438/463; 438/57; 438/667; 438/308

(58) Field of Classification Search .................. 438/460, 438/113, 458, 462, 33, 192, 459, 667, 612, 438/68, 114, 463, 797, 584, 792, 795, 771, 438/746, 485, 486, 487, 473, 308, 57
See application file for complete search history.

(56) References Cited

U.S. PATENT DOCUMENTS

2007/0105345 A1 * 5/2007 Kurosawa ..................... 438/460

FOREIGN PATENT DOCUMENTS

| JP | 6-232255 | 8/1994 |
| JP | 2006-222359 | 8/2006 |

* cited by examiner

Primary Examiner — Chuong A. Luu (74) Attorney, Agent, or Firm — McGinn IP Law Group, PLLC (57) ABSTRACT

An improved yield of chips is realized by reducing the width of dicing streets on the front surface side of a semiconductor wafer. A method for semiconductor chip, divided a semiconductor wafer 10 having a plurality of circuit patterns formed on one surface 18 into pieces, comprising, forming a groove in a boundary region between the circuit patterns from the other surface 19 of the semiconductor wafer 10 by using a blade, forming a modified layer 14 in the boundary region between the circuit patterns by irradiation with laser light L from the one surface 18 or the other surface 19 of the semiconductor wafer 10, and dividing the semiconductor wafer into pieces by breaking the modified layer 14. The modified layer 14 is formed between a bottom surface 17 of a groove portion 16 and the one surface 18 of the semiconductor wafer 10, and a forming width WM of the modified layer 14 is smaller than the width of the groove portion 16.

13 Claims, 7 Drawing Sheets

METHOD FOR MANUFACTURING SEMICONDUCTOR CHIP AND SEMICONDUCTOR DEVICE

BACKGROUND OF THE INVENTION

1. Field of the Invention

The present invention relates to a semiconductor chip manufacturing method in which a semiconductor wafer is divided into individual semiconductor chips, and also relates to a semiconductor device including a divided individual semiconductor chip.

2. Description of the Related Art

Japanese Patent Laid-Open No. 2006-222359 describes, as an invention of this kind, a manufacturing method in which a semiconductor wafer is half cut along a dicing line from the semiconductor wafer other surface side with a dicing blade of a larger width and is thereafter full cut from the semiconductor wafer front surface side with a dicing blade of a smaller width to form individual semiconductor chips.

According to the description of this dicing method, the dicing thickness at the time of full cutting from the front surface side is reduced and, therefore, the accuracy of the dicing position is improved and the occurrence of a chip or a crack in the semiconductor chip surface is prevented.

Japanese Patent Laid-Open No. 6-232255 describes a semiconductor chip manufacturing method in which a V-groove is formed in a semiconductor wafer from the semiconductor wafer other surface side with a bevel cutting blade and the semiconductor wafer is thereafter full cut from the semiconductor wafer front surface side with a dicing blade of a width smaller than that of the V-groove.

In recent years, semiconductor devices, such as display devices exemplified by semiconductor devices for liquid crystal display drivers, have been developed in which the aspect ratio of the one surface of a semiconductor chip is high. If the aspect ratio of the one surface of a semiconductor chip is increased so that the entire chip is elongated, the semiconductor chip becomes easily crackable by an external force such as a bending or torsional force. In such a case, a desirable mechanical strength of the chip is secured by securing a comparatively large size in thickness. For example, the shorter-side size of the one surface of a semiconductor chip, for example, in a semiconductor device for a liquid crystal display driver is about 800 μm while the size in thickness is large, about 400 to 700 μm.

In dicing a semiconductor wafer, there is a need to set the thickness of the edge of a dicing blade equal to or larger than a certain value. This is because, if the edge thickness is equal to or larger than a certain value with respect to the dicing depth (edge projection amount), the edge bends to such an extent that dicing cannot be correctly performed.

Each of the semiconductor manufacturing methods described in the above-mentioned patent documents therefore entails a limitation to the reduction in thickness of the edge of a dicing blade for full cutting a half-cut semiconductor wafer from the wafer front surface side.

With respect to semiconductor devices and optical waveguide devices in recent years, there is a demand for improving the yield of semiconductor chips in a semiconductor wafer by reducing the thickness of dicing lines provided on the semiconductor wafer.

SUMMARY

The present invention provides a method for manufacturing a semiconductor chip, divided a semiconductor wafer having a plurality of circuit patterns formed on one surface into pieces, comprising: forming a groove in a boundary region between the circuit patterns from the other surface of the semiconductor wafer by using a blade; forming a modified layer in the boundary region between the circuit patterns by laser irradiation from the one or the other surface of the semiconductor wafer; and dividing the semiconductor wafer into pieces by breaking the modified layer, wherein the modified layer is formed between a bottom surface of the groove and the one surface of the semiconductor wafer, and the width of the modified layer is smaller than the width of the groove.

The plurality of steps in the above-described invention may be performed in arbitrary order except when a particular order is explicitly specified. In particular, the order of execution of the step of forming the groove in the semiconductor wafer and the step of forming the modified layer by laser irradiation can be freely set.

In a case where the step of forming the modified layer is performed after the completion of the step of forming the groove, the semiconductor wafer having the groove and the bottom portion of the groove formed therein in advance is irradiated with laser light to form the modified layer. In a case where the step of forming the groove is performed after the completion of the step of forming the modified layer, the semiconductor wafer not yet having the groove and the bottom surface of the groove formed therein is irradiated with laser light.

Accordingly, in the above-described invention, forming the modified layer between the bottom surface of the groove and the one of the two surfaces of the semiconductor wafer includes a case where the modified layer is formed between the bottom surface of the groove formed in advance and the one of the two surfaces of the semiconductor wafer, and a case where the modified layer is formed between the position at which the bottom surface of the groove is to be formed and the one of the two surfaces of the semiconductor wafer.

Also, the execution of the plurality of steps in the above-described invention is not limited to respectively executing the steps in different time periods. For example, the time period during which one of the steps is executed may contain a time at which the execution of another of the steps is started, and the time period during which one of the steps is executed and the time during which another of the steps is executed may coincide with each other or may overlap each other. In particular, the step of forming the modified layer by laser irradiation and the step of dividing the semiconductor wafer into pieces by breaking the formed modified layer may be simultaneously with each other.

According to the above-described invention, the modified layer is formed by laser irradiation on the one of the two surfaces of the semiconductor wafer having circuit patterns formed thereon, and the modified layer is broken to divided the semiconductor wafer into semiconductor chips. In this way, the width of the dicing line in the circuit pattern formation surface can be reduced in comparison with the method of cutting the semiconductor wafer by cutting the one of the two surfaces of the semiconductor wafer with a blade, thus improving the yield of semiconductor chips in the semiconductor wafer.

It is not necessarily required that the various components of the present invention be independent of each other. A plurality of components may be formed as one member; one component may be formed by a plurality of members; one component may constitutes a portion of another component; and one component and another component may have a portion common to each other.

According to the semiconductor chip manufacturing method of the present invention, the width of the dicing line in the circuit pattern formation surface can be reduced and, therefore, the yield of semiconductor chips can be improved.

BRIEF DESCRIPTION OF THE DRAWINGS

FIGS. 3A to 3C are schematic diagrams showing a breaking step in the first embodiment;

DETAILED DESCRIPTION OF THE PREFERRED EMBODIMENTS

Embodiments of the present invention will be described with reference to the accompanying drawings. In all the drawings, components identical or corresponding to each other are indicated by the same reference numerals. Such components will be described by avoiding redundancies of description.

Figure 1A:
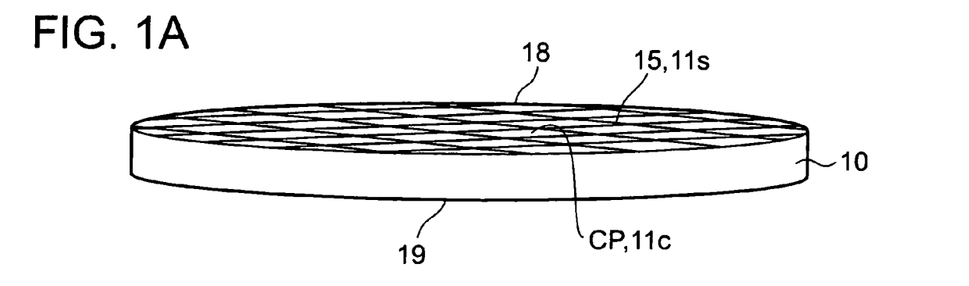
FIG. 1A is a perspective view of a semiconductor wafer.
Figure 1B:
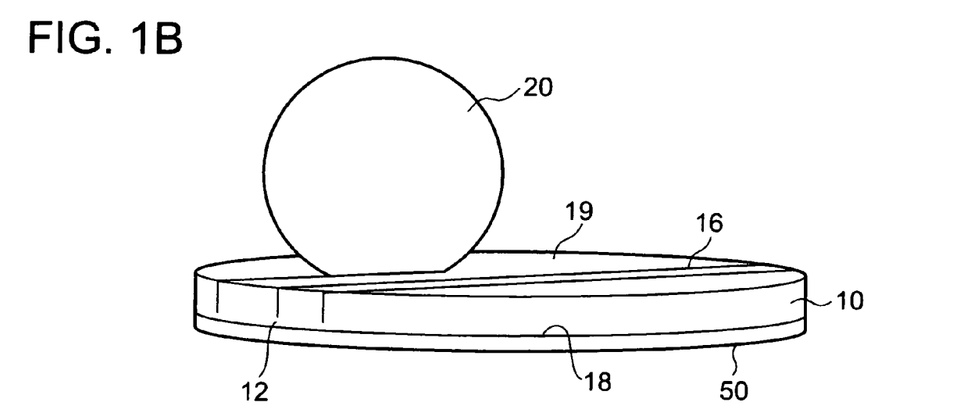
FIG. 1B is a perspective view schematically showing a cutting step in a first embodiment of the present invention.
Figure 1C:
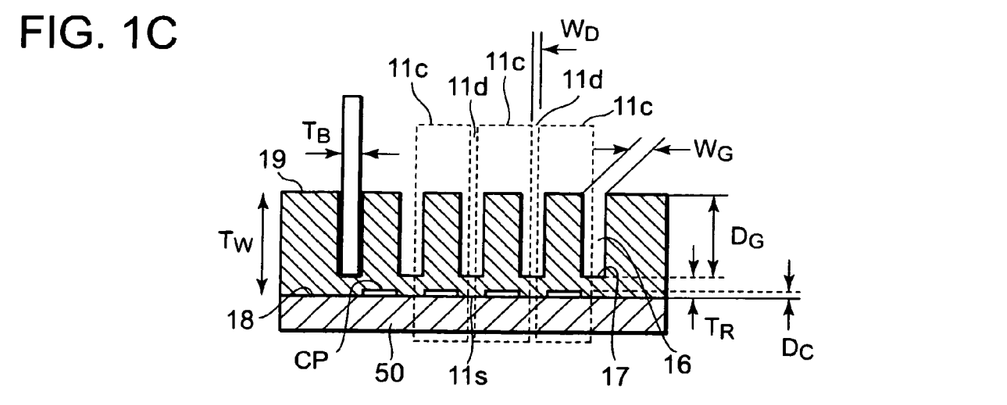
FIG. 1C is a longitudinal sectional view of the semiconductor wafer in a state of being cut perpendicularly to the direction of feed of a blade.

FIG. 1A is a perspective view of a semiconductor wafer 10 to be divided into pieces. A one surface 18 of the semiconductor wafer 10 is at the top side of the figure. FIG. 1C is a perspective view schematically showing a cutting step. The one surface 18 of the semiconductor wafer 10 is at the bottom side of the figure. FIG. 1C is a longitudinal sectional view of the semiconductor wafer 10 in a state of being cut perpendicularly to the direction of feed of a blade 20.

Figure 2A:
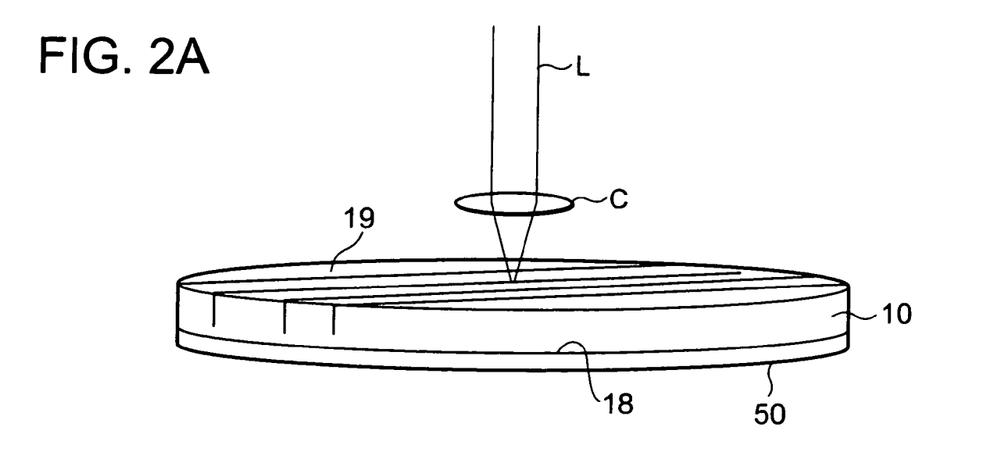
FIG. 2A is a perspective view schematically showing an irradiation step in the first embodiment.
Figure 2B:
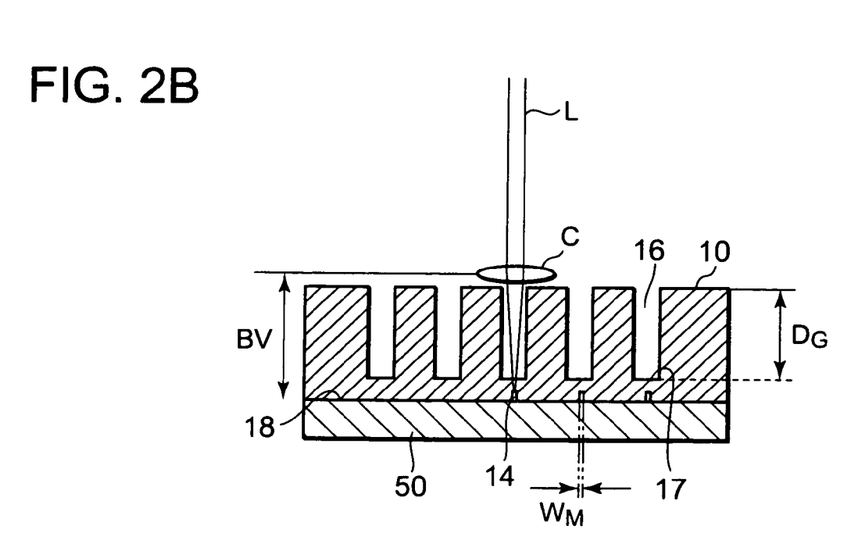
FIG. 2B is a longitudinal sectional view of the semiconductor wafer in a state of being cut perpendicularly to the direction of feed of laser light.

FIG. 2A is a perspective view schematically showing an irradiation step. FIG. 2B is a longitudinal sectional view of the semiconductor wafer 10 in a state of being cut perpendicularly to the direction of feed of laser light L.

Figure 3A:
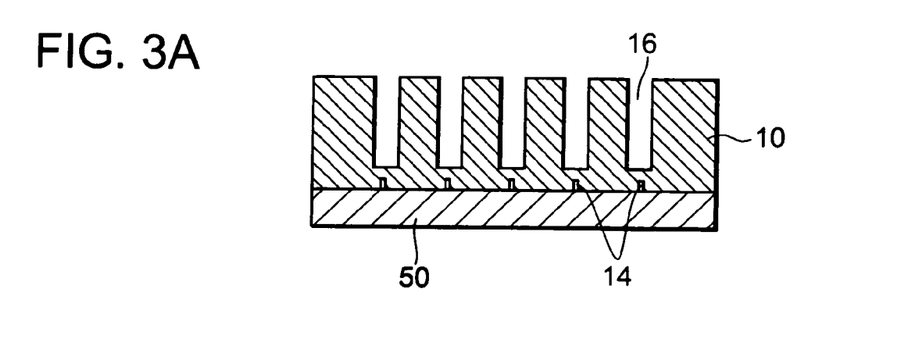
FIG. 3A is an elevation view of the semiconductor wafer before breaking.
Figure 3B:
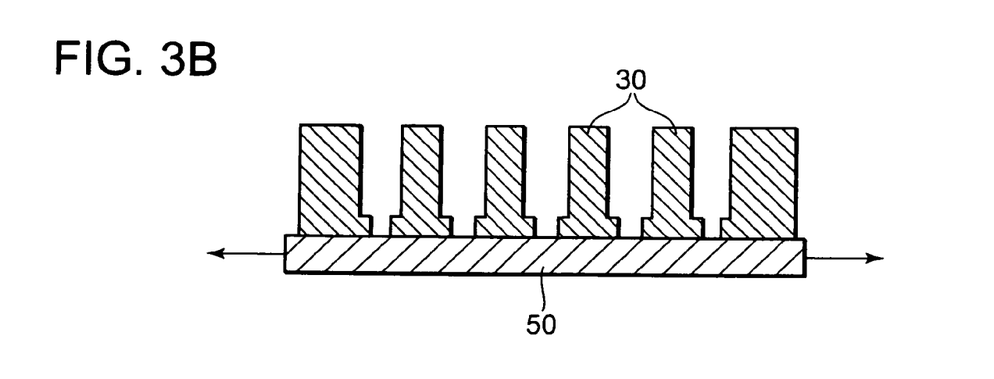
FIG. 3B is an elevation view showing a state where the semiconductor wafer is divided into a multiplicity of chips.
Figure 3C:
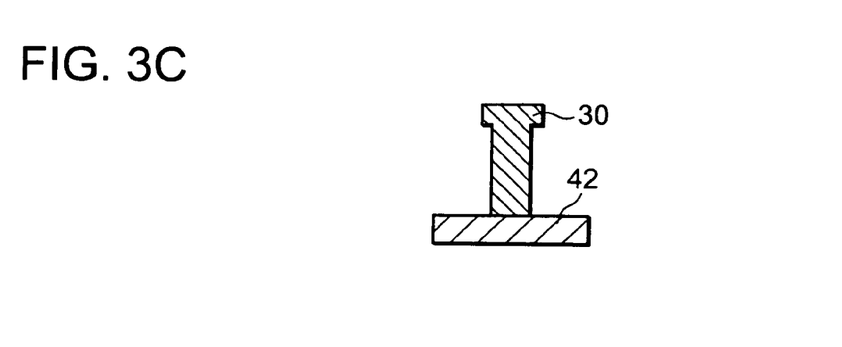
FIG. 3C is an elevation view of a device obtained by mounting a divided individual chip on a substrate.

FIGS. 3A to 3C are schematic diagrams showing a breaking step. FIG. 3A is an elevation view of the semiconductor wafer 10 in a state of having grooves 16 formed on the other surface side and modified layers 14 formed on the front surface side before breaking. FIG. 3B is an elevation view showing a state where a surface protective sheet 50 to which the one surface 18 of the semiconductor wafer 10 is joined is expanded in an in-plane direction to divide the semiconductor wafer 10 into a multiplicity of individual semiconductor chips 30. FIG. 3C is an elevation view of a device 100 obtained by separating one of the divided individual chips 30 from the surface protective sheet 50, turning the chip 30 upside down and mounting the chip 30 on a substrate 42.

First Embodiment

A method of manufacturing a semiconductor chip (referred to simply as "chip" in some case in the following) according to the first embodiment of the present invention will first be outlined.

In the manufacturing method in the present embodiment, a semiconductor wafer 10 having a plurality of circuit patterns CP formed in one surface (one surface 18) is divided into pieces.

The manufacturing method in the present embodiment includes a step (cutting step) of forming grooves (groove portions 16) in boundary regions (dicing regions 11d) between the circuit patterns CP from the other surface (other surface 19) of the semiconductor wafer 10 by using a blade 20, a step (irradiation step) of forming modified layers 14 in the dicing regions 11d by performing irradiation with laser light from the one surface 18 or the other surface 19 of the semiconductor wafer 10, and a step (breaking step) of dividing the semiconductor wafer 10 into pieces by breaking the modified layers 14.

In the manufacturing method in the present embodiment, modified layers 14 are formed between the bottom surfaces of the groove portions 16 and the one surface 18 of the semiconductor wafer 10, and the width of the modified layers 14 is smaller than the width of the groove portions 16.

(Semiconductor Wafer)

The semiconductor wafer 10 to be diced in the present embodiment has the one surface 18 as one surface of a substrate, and a plurality of circuit patterns CP arranged in a pattern in the surface and an inner portion of the substrate. The substrate is, for example, a silicon substrate or a glass substrate.

The semiconductor wafer includes a Si substrate and a multi-layer interconnect structure formed on the one surface 18 side. The multi-layer interconnect structure may include an area formed a low dielectric constant (low-k) film, which is lower than the dielectric constant Of $SiO_2$.

As shown in FIG. 1A, the semiconductor wafer 10 is provided with regions in which circuit patterns CP are formed (chip regions 11c) and dicing regions 11d in stripe form extending along two directions perpendicular to each other. The dicing regions 11d are boundary regions between the circuit patterns CP adjacent to each other.

The chip regions 11c and the dicing regions 11d are spatial regions sectioned and formed in the semiconductor wafer 10. The semiconductor wafer 10 is cut (diced) in the thickness direction through dicing streets 11s which are regions in band form having a predetermined width as a dicing width and defined within the dicing regions 11d, thereby obtaining divided individual chips 30 (see FIG. 3C).

The widthwise center of each dicing street 11s in band form is referred to as a dicing line 15. The dicing lines 15 in the present embodiment form a lattice having unit portions surrounding the circuit patterns CP.

Each of the divided individual chips 30 is used in a device arrangement such as a semiconductor device, a system on glass (SOG) or an optical waveguide device, for example, by being mounted on a substrate 42 in a posterior step.

In the manufacturing method in the present embodiment, the width of the dicing streets 11s is changed between on the one surface 18 side and the other surface 19 side. More specifically, on the other surface 19 side, larger-width cutting is performed by using the blade 20. On the one surface 18 side, modified layers 14 are formed in the semiconductor wafer 10 by irradiating the semiconductor wafer 10 with laser light L and are broken or cut by being molten, thus forming the dicing streets 11s with a smaller width.

In the following, "dicing street 11s" represents the dicing width on the one surface 18 side that influences the yield of chips in the semiconductor wafer 10, unless otherwise mentioned.

As shown in FIGS. 1A to 1C, the semiconductor wafer 10 to be cut in the present embodiment is generally circular and is cut along two directions perpendicular to each other to be divided into rectangular chips 30. In the present embodiment, the semiconductor wafer thickness TW is about 400 to 700 μm.

The other surface 19 of the semiconductor wafer 10 may be polished before the cutting step so that the semiconductor wafer thickness TW is equal to a predetermined thickness.

The circuit patterns CP are formed in the chip regions 11c from the one surface 18 of the semiconductor wafer to an internal portion of the semiconductor wafer 10. The positions at which the circuit patterns CP are formed and a depth DC through which the circuit patterns CP are formed are not particularly specified. In the present embodiment, the circuit patterns CP are formed through a thickness of 20 to 30 μm from the one surface 18 of the semiconductor wafer 10 dispersedly within the chip regions 11c.

In some case, a metal film called an accessory is partially formed within the dicing regions 11d. As accessories, a dummy pattern for improving film forming for the circuit patterns CP, a test pattern for checking this and alignment marks for positioning the semiconductor wafer 10 and the like may be formed. Accessories may be formed at the same depth position as the circuit patterns CP or may be formed thinner on the one surface 18 side of the circuit patterns CP.

(Cutting Step)

In the cutting step shown in FIG. 1B, the semiconductor wafer 10 is cut along the dicing regions 11d from the other surface 19 side of the semiconductor wafer 10 to a depth DG by using the blade 20. The cutting step may be performed before the irradiation step described below or after the irradiation step.

In the present embodiment, the cutting step is performed before the irradiation step.

The cutting step in the present embodiment is performed by half cutting the semiconductor wafer 10 from the other surface side with the cutting blade 20.

A surface protective sheet 50 is attached to the one surface 18 of the semiconductor wafer 10. The surface protective sheet 50 is a resin film for protecting the circuit patterns CP on the semiconductor wafer 10 at the time of polishing.

By the cutting step, the groove portions 16 are formed in the other surface 19 of the semiconductor wafer 10, with portions of a certain thickness between bottom surfaces 17 of the groove portions 16 and the one surface 18 left as uncut regions 12. The groove portions 16 are provided along the dicing regions 11d.

As described above, the circuit patterns CP (multi-layer interconnect structure) of the semiconductor wafer may include the area formed the low-k film. The area is formed between the bottom surface of the groove and the one surface of the semiconductor wafer. Since the area is formed between the bottom surface of the groove and the one surface of the semiconductor wafer, a problem such as a delamination of the low-k film is prevented. Moreover, if the groove is formed from the other surface of the semiconductor to, at least, an interface between the substrate and the multi-layer interconnect structure, high throughput is carried out.

The groove width WG of the groove portions 16, i.e., the dicing width on the other surface side, which is the sum of the blade thickness TB of the blade 20 and a cutting margin, is larger than the width WD of the dicing regions 11d.

Therefore the groove portions 16 overlap the chip regions 11c on the other surface side of the semiconductor wafer 10.

In the present embodiment, more specifically, the blade thickness TB may be about 70 to 80 μm, and the groove width WG of the groove portion 16, which is a sum of TB and a cutting margin, may be about 75 to 100 μm.

As the blade 20, a so-called electroformed blade formed by dispersing diamond abrasive grains in a metallic material such as nickel can be used. Some other blade such as a resin-bonded blade or a metal-bonded blade may alternatively be used.

The depth of half cutting with the blade 20 is not particularly specified. In the present embodiment, however, the circuit patterns CP are formed between the bottom surfaces 17 of the groove portions 16 and the one surface 18 of the semiconductor wafer 10. Therefore the depth DG position of the groove portions 16 cut with the blade 20 is on the semiconductor wafer 10 other surface side of the forming depth (DC) position of the circuit patterns CP provided in the semiconductor wafer 10 on the front surface side. That is, the thickness TR of the uncut regions 12 is equal to or larger than the forming depth DC of the circuit patterns CP.

On the other hand, the thickness TR of the uncut regions 12 is set to half or less of the semiconductor wafer thickness TW to enable the irradiation step described below to be performed by performing irradiation with laser light L a reduced number of times for a reduced irradiation time. More specifically, the thickness TR of the uncut regions 12 is set to 20 to 200 μm, preferably 50 to 100 μm.

(Irradiation Step)

In the irradiation step shown in FIGS. 2A and 2B, a surface or an inner portion of each uncut region 12 of the semiconductor wafer 10 half cut in the cutting step is irradiated with laser light L to form a modified layer 14.

Breaking of the semiconductor wafer 10 is made easier in modified layers 14, and the uncut regions 12 are broken simultaneously with the irradiation step or in the breaking step after the irradiation step without using the blade.

More specifically, irradiation with laser light L from the one surface 18 side or the other surface 19 side of the semiconductor wafer 10 is performed to form the modified layer 14 along the dicing line 15 within the width region (groove width 16) to be cut with the blade 20 and on the one surface 18 side of the depth DG to which the semiconductor wafer 10 is cut.

In the irradiation step, the semiconductor wafer 10 having the groove portions 16 half cut with the blade 20 in advance or each of regions inside the positions at which the groove portions 16 are to be formed in the semiconductor wafer 10 not yet having the groove portions 16 completed may be irradiated with laser light L.

Also, irradiation with laser light L from the front surface side of the semiconductor wafer 10 or from the other surface side of the semiconductor wafer 10 may be performed.

More specifically, in the present embodiment, the irradiation step is performed after the cutting step. That is, modified layers 14 are formed in surfaces or inner portions of the uncut regions 12 of the semiconductor wafer 10 half cut with the blade 20 in advance. The modified layers 14 are thus formed in lattice form along the groove portions 16, i.e., in such form as to respectively surround the circuit patterns CP.

The depth position at which each modified layer 14 is formed is not particularly specified. The modified layer 14 may be formed in any of a surface portion on the front surface side, a surface portion on the other surface side and an inner portion of the uncut region 12.

As laser light L, suitable laser light may be selected and used according to the material of the semiconductor wafer 10 and an absorption wavelength due to the material.

For example, if the semiconductor wafer 10 is made of silicon, use of a YAG third harmonic laser (wavelength: 355 nm) is preferred. If the semiconductor wafer 10 is made of quartz glass, use of a carbon dioxide ($CO_2$) laser (wavelength: 10.6 μm) is preferred.

Laser light L may be continuous laser light or pulsating laser light. If pulsating laser light is applied as laser light L, it is preferable to perform scanning while causing pulse of light to overlap each other along the dicing line 15.

More specifically, in a case where a monocrystal silicon semiconductor wafer is used as the semiconductor wafer 10, it is preferable to irradiate the semiconductor wafer 10 with laser light L by using the above-mentioned YAG third harmonic laser as a light source and by setting the laser power to 1.2 W, the scanning speed to 300 mm/sec and the number of scanning lines to 1.

In the present embodiment, each modified layer 14 is formed by condensing laser light L at a predetermined depth position in the semiconductor wafer 10 with a condenser lens C provided in opposition to the other surface 19 of the semiconductor wafer 10. Laser light L condensed to have high-density energy forms a laser irradiation mark on the material of the semiconductor wafer 10.

The laser irradiation mark can exist in any of various forms. For example, the laser irradiation mark is generated in the semiconductor wafer 10 as an aggregate of minute cracks (crack spot), as a molten or resolidified region or as a region having the crystalline structure changed. In the description of the present embodiment, such a laser irradiation mark is referred to as a modified layer.

In the irradiation step in the present embodiment, irradiation with laser light L from the other surface side of the semiconductor wafer 10 is performed.

Therefore the focal length BV from the condenser lens C to the modified layer 14 is larger than the depth DG of the groove portion 16. Laser light L emitted from an irradiation device (not shown) placed above as viewed in FIG. 2B is condensed when passing through the condenser lens C, passes through the groove width WG of the groove portion 16 formed in the other surface 19 of the semiconductor wafer 10 in advance, and enters the uncut region 12 from the bottom surface 17 of the groove portion 16.

In the present embodiment, the laser light L condensation point is set in the vicinity of the one surface 18 in the uncut region 12. The modified layer 14 is thereby formed through a partial thickness on the one surface 18 side in the uncut region 12.

The width of irradiation with laser light L at the condensation point is smaller than the width of the uncut region 12, i.e., the groove width WG of the groove portion 16. In the present embodiment, the irradiation width is set to 10 μm or less. The forming width WM of the modified layers 14 formed in the present embodiment is smaller than the width of the blade 20 (blade width TB) and corresponds to a central portion of the laser light L irradiation width at which the energy density is higher. Accordingly, the forming width WM of the modified layers 14 formed in the present embodiment is one to several microns.

The laser light L irradiation position within the width of each uncut region 12 coincides with the position of the dicing line 15 on the front surface side of the semiconductor wafer 10.

The widthwise center of the groove portion 16, which is a dicing line on the other surface side of the semiconductor wafer 10, and the widthwise center of the modified layers 14, which is a dicing line on the front surface side, may be either aligned or misaligned with each other.

(Breaking Step)

In the present embodiment, as shown in FIG. 3A, the breaking step of dividing the semiconductor wafer into pieces is performed on the semiconductor wafer 10 having the groove portions 16 and the modified layers 14 formed in advance. In the breaking step in the present embodiment, the semiconductor wafer 10 is broken along the modified layers 14 to be divided into individual chips 30.

As a method of breaking the semiconductor wafer 10 along the modified layers 14, a method of artificially applying an external force to the semiconductor wafer 10 and a method of utilizing the occurrence of spontaneous breaking exist. With respect to a case where an external force is applied, no particular method of applying the external force and no particular direction of application are specified. For example, a method of causing tensile stress, bending stress or shearing stress in the semiconductor wafer 10 and a method of causing thermal stress on the basis of a temperature difference are conceivable.

In the present embodiment, as shown in FIG. 3B, the surface protective sheet 50 adhered to the one surface 18 of the semiconductor wafer 10 is expanded in an in-plane direction (in the directions of the arrows) to pull the semiconductor wafer 10 having the groove portions 16 and the modified layers 14 formed therein, thereby breaking the semiconductor wafer 10 in the modified layers 14.

It is, therefore, preferable to use an expandable tape as the surface protective sheet 50.

Each chip 30 broken off is separated from the surface protective sheet 50 and is mounted on the substrate 42 after being turned upside down as shown in FIG. 3C if necessary. However, if the chip 30 is a semiconductor chip of a flip chip type, turning upside down is unnecessary.

The operation and advantages of the above-described present embodiment will be described.

The manufacturing method in the present embodiment includes the cutting step of forming the groove portions 16 in the dicing regions 11d from the other surface side of the semiconductor wafer 10 by using the blade 20, the irradiation step of forming the modified layers 14 in the dicing regions 11d by irradiation with laser light L from the one surface side or the other surface side of the semiconductor wafer 10, and the breaking step of dividing the semiconductor wafer 10 into pieces by breaking the modified layers 14. In this way, a larger chip size is secured on the one surface 18 side on which the circuit patterns CP are formed, thereby achieving an improvement in chip yield.

On the other surface side on which the circuit patterns CP are not formed, because an increase in the groove thickness WG of the groove portions 16 does not influence the chip yield, high-speed cutting with the comparatively thick blade 20 is performed to secure a higher throughput through the entire dicing process.

The semiconductor wafer 10 provided in the manufacturing method of the present embodiment has the circuit patterns CP formed in its inner portion on the front surface side. The depth of cutting with the blade 20 is set so that the circuit patterns CP are formed between the bottom surfaces 17 of the groove portions 16 and the one surface 18 of the semiconductor wafer 10. That is, the edge of the blade 20 put in the semiconductor wafer 10 from the other surface side of the same in the cutting step does not reach the forming depth DC position of the circuit patterns CP. Therefore, even if chipping occurs in the semiconductor wafer 10 by an impact in the cutting step, the semiconductor wafer 10 is thereby expanded laterally (in a widthwise direction) and no damage to the circuit patterns CP is caused.

In the manufacturing method in the present embodiment, the semiconductor wafer 10 is half cut from the other surface 19 side in the cutting step and surfaces or inner portions of the uncut regions 12 are thereafter irradiated with laser light L to form the modified layers 14. That is, the irradiation step is performed after the cutting step. Therefore, the semiconductor wafer 10 does not break unstably in the cutting step in which a larger impact is applied, thus reducing the occurrence of chipping in the cutting step.

In the manufacturing in the present embodiment, the thickness TR of the uncut regions 12 after half cutting is set to 20 to 200 µm. When the thickness TR is 20 µm or more, the edge of the blade 20 does not reach the depth position (forming depth DC) of the circuit patterns CP ordinarily formed on the surface side of the semiconductor wafer 10. By setting the thickness TR of the uncut regions 12 to 50 µm or more in particular, a sufficient distance from the depth position reached by the blade 20 to the forming depth DC position of the circuit patterns CP is secured to reduce the possibility of the circuit patterns CP being damaged by chipping in the cutting step.

On the other hand, the thickness TR of the uncut regions 12 is set to 200 µm or less to enable the semiconductor wafer 10 to be broken by using the modified layers 14 formed by setting a reduced irradiation time and a reduced amount of irradiation.

In particular, the thickness TR of the uncut regions 12 is set to 100 µm or less to enable the semiconductor wafer 10 to be broken by expanding by using the modified layers 14 formed by performing the irradiation step one time.

In the manufacturing in the present embodiment, the breaking step is performed on the semiconductor wafer 10 having undergone the cutting step and the irradiation step to have the groove portions 16 and the modified layers 14 formed thereon in advance. According to the manufacturing method, the semiconductor wafer 10 is made easily breakable along the modified layers 14 provided in the uncut regions 12 in the semiconductor wafer 10 having the groove portions 16 formed therein. In a case where the semiconductor wafer 10 is a monocrystal silicon semiconductor wafer in particular, cleavage can occur easily in the semiconductor wafer 10 starting from the modified layers 14. Thus, the modified layers 14 having a reducing forming width WM enable breaking of the semiconductor wafer 10. Therefore each of the forming width and the forming thickness of the modified layers 14 can be reduced in comparison with the case of melting the uncut regions 12 with laser light L. As a result, the laser light L irradiation width can be largely reduced to improve the chip yield.

In a case where the uncut regions 12 are cut with a blade from the front surface side as in the chip manufacturing method described in Japanese Patent Laid-Open No. 2006-222359, a cutting margin of 5 to 10 µm is ordinarily required in addition to the edge thickness of the blade (ordinarily at least about 15 µm) and a dicing street correspondingly increased in thickness is required in the one surface of the semiconductor wafer 10.

Also, when the modified layers 14 are formed in the semiconductor wafer 10 by irradiation with laser light L, none of the constituents of the material of the semiconductor wafer 10 scatters and no foreign object is produced as a cause of contamination of the chips 30. Therefore no special cleaning step is required in the irradiation step and the breaking step in the present embodiment in contrast with the case of cutting the uncut regions 12 by cutting with a blade or laser melting.

In the present embodiment, the uncut region 12 is irradiated with laser light L from the other surface side of the semiconductor wafer 10. That is, each of half cutting and irradiation with laser light L is performed from the other surface side. There is, therefore, no need to turn the semiconductor wafer 10 upside down between the cutting step and the irradiation step.

An accessory, which may be provided within the dicing streets 11s in the one surface 18 of the semiconductor wafer 10, is made of a metallic material such as aluminum or copper and blocks laser light L. In the case of irradiation with laser light L from the other surface side as in the present embodiment, there is no possibility of laser light L being blocked by the metallic accessory. Therefore the modified layers 14 can be formed with stability no matter what the laser transmission characteristics with respect to the front surface side of the uncut regions 12.

Also, in the manufacturing method in the present embodiment, the modified layers 14 are formed in portions of the uncut regions 12 closest to the front surface side. The modified layers 14 are regions in which breaks in the semiconductor wafer 10 can start to divide the semiconductor wafer 10 into chips 30 in the breaking step. By forming the modified layers 14 closest to the front surface side, therefore, the possibility of chipping in the vicinity of the one surface 18 side at the time of breaking of the semiconductor wafer 10 is reduced. Consequently, according to the present embodiment, damage to the circuit patterns CP formed in the one surface by chipping at the time of breaking is prevented.

Various modifications of the present embodiment are permitted.

A first modified example may be such that after forming the modified layers 14 in the semiconductor wafer 10 by performing the irradiation step, the semiconductor wafer 10 is half cut from the other surface side of the semiconductor wafer 10 with the blade 20.

That is, the semiconductor wafer 10 is irradiated with laser light L from the front surface side or the other surface side to first form the modified layers 14 in the dicing streets 11s on the one surface 18 side of the depth position at which the groove portions 16 are to be formed.

Next, the semiconductor wafer 10 is half cut to a predetermined depth (depth DG) with the blade 20. The modified layers 14 are thereafter broken, preferably by applying an external force to the semiconductor wafer 10 by pulling the semiconductor wafer 10 in an in-plane direction.

In a case where the irradiation step is performed before the cutting step as in this modified example, irradiation with laser L can be performed before adhering the surface protective sheet 50 to the one surface 18 after forming the circuit patterns CP in the semiconductor wafer 10.

A second modified example may be such that in a case where the one surface 18 is protected in the cutting step and in the irradiation step with a surface protective sheet 50 having low expandability, the surface protective sheet 50 is separated after the irradiation step and an expandable dicing sheet (expand sheet) is thereafter adhered to the front or other surface of the semiconductor wafer 10. The semiconductor wafer 10 may be broken by expanding the dicing sheet in an in-plane direction.

When the sheet adhered to the semiconductor wafer 10 is changed from the surface protective sheet 50 to the dicing sheet, a die bonding material in film form may be interposed between the semiconductor wafer 10 and the dicing sheet.

Second Embodiment

Figure 4A:
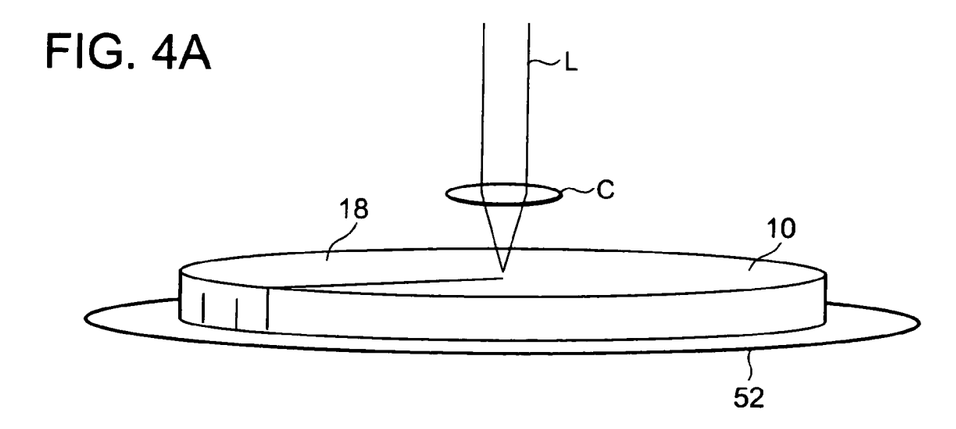
FIG. 4A is a perspective view schematically showing an irradiation step in a second embodiment of the present invention.
Figure 4B:
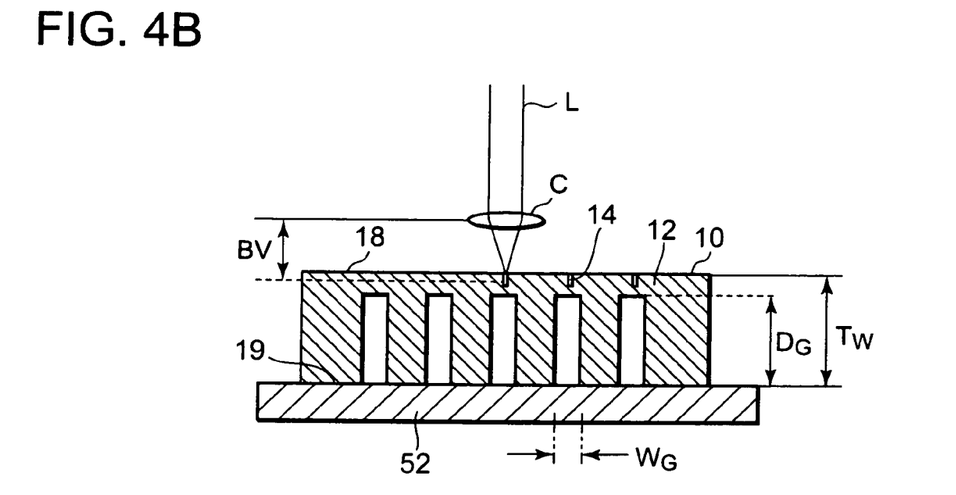
FIG. 4B is a longitudinal sectional view of a semiconductor wafer cut perpendicularly to the direction of feed of laser light.

FIG. 4A is a perspective view schematically showing an irradiation step in the second embodiment of the present invention. FIG. 4B is a longitudinal sectional view of a semiconductor wafer 10 cut perpendicularly to the direction of feed of laser light L.

In the irradiation step in the present embodiment, irradiation with laser light L from the front surface side of the semiconductor wafer 10 is performed.

That is, the semiconductor wafer 10 half cut to a predetermined depth (depth DG) in a cutting step is flipped and laser light L is condensed with a condenser lens C provided in opposition to the one surface 18 of the semiconductor wafer 10 to form modified layers 14 in surfaces or inner portions of uncut regions 12. The position at which each modified layer 14 is formed and the size in which each modified layer 14 is formed are the same as those in the first embodiment.

A surface protective sheet 50 protecting the one surface 18 in the cutting step is separated before the irradiation step and an expandable dicing sheet 52 is adhered to the other surface 19 of the semiconductor wafer 10.

In the irradiation step in the present embodiment, boundary regions (dicing regions 11d) between circuit patterns CP are molten and cut by being irradiated with laser light L, thus performing a breaking step together with the irradiation step. That is, the wavelength and output power of laser light L for irradiation are changed from those in the first embodiment to cut the semiconductor wafer 10 in the irradiation step.

According to the present embodiment, since the modified layers 14 are formed on the one surface 18 side of the semiconductor wafer 10, the focal length BV from the condenser lens C to the modified layer 14 can be reduced. Therefore the accuracy of the forming height position of the modified layers 14 is improved.

It is preferable that once laser light L condensed at the predetermined depth position in the semiconductor wafer 10 enters the semiconductor wafer 10, it reach the condensation point at the modified layer 14 without getting out to the air layer, because laser light L is refracted and reflected in a complicated manner at the interface between the semiconductor wafer 10 and the air. In the case of performing irradiation with laser light L from the other surface side as shown in FIG. 2B, therefore, it is preferable that laser light L condensed by the condenser lens C reaches the bottom surface 17 of the groove portion 16 by passing within the groove width WG of the groove portion 16. With respect to the semiconductor wafer 10 having a large semiconductor wafer thickness TW and a long focal length BV, therefore, it is desirable to increase the groove width WG of the groove portion 16 to such an extent that uncondensed laser light L after passage through the condenser lens C can be received.

In contrast, in a case where irradiation with laser light L from the front surface side of the semiconductor wafer 10 is performed as shown in FIG. 4B according to the present embodiment, the groove width WG of the groove portion 16 can be set comparatively small.

Also, in the manufacturing method in the present embodiment, the irradiation step and the breaking step are performed simultaneously with each other in such a manner that the uncut region 12 is irradiated with laser light L so that the uncut region 12 is molten and cut. Thus, the number of dicing steps can be reduced without requiring separately providing the breaking step after the irradiation step.

Third Embodiment

Figure 5A:
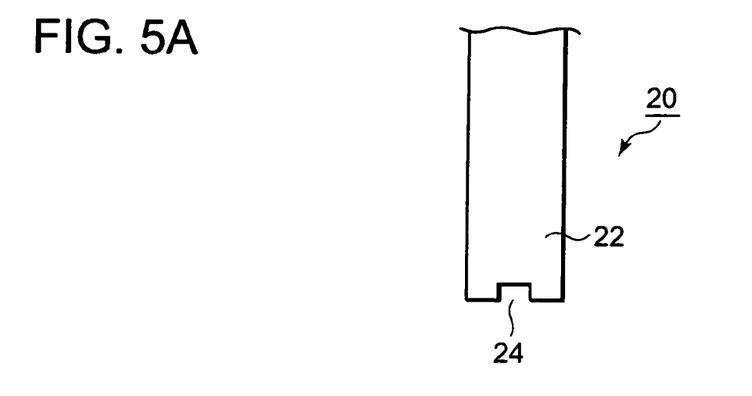
FIG. 5A shows in section the shape of an edge portion of a blade used in a third embodiment of the present invention.
Figure 5B:
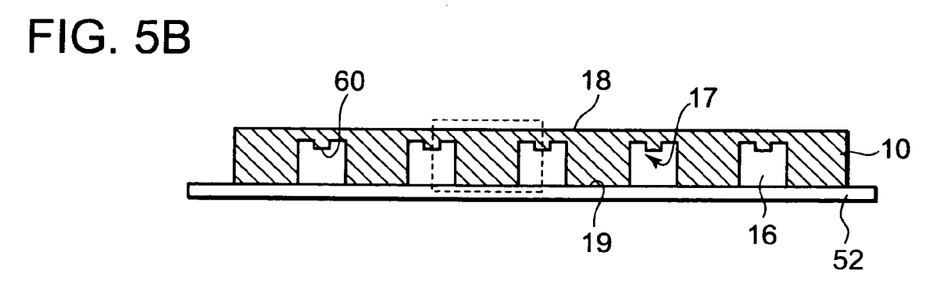
FIG. 5B is a sectional view of a semiconductor wafer half cut.
Figure 5C:
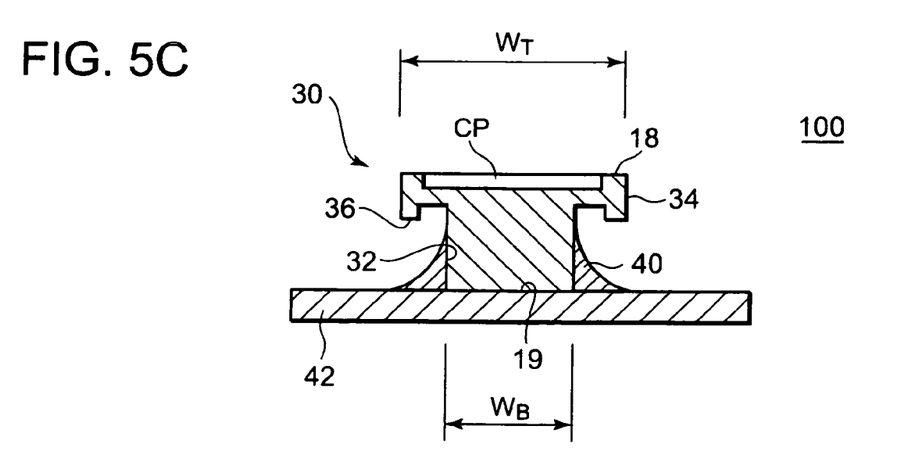
FIG. 5C is a sectional view of a device formed by joining a divided individual chip to a substrate.

FIG. 5A shows in section the shape of an edge portion of a blade 20 used in the third embodiment of the present invention. FIG. 5B is a sectional view of a semiconductor wafer 10 when the semiconductor wafer 10 undergoes a cutting step to be half cut form the other surface side (from below as viewed in the figure) with the blade 20. FIG. 5C is a sectional view of a device 100 formed by joining to a substrate 42 a divided individual chip 30 obtained by performing an irradiation step and a breaking step.

The semiconductor wafer 10 to be diced in the present embodiment is a semiconductor wafer formed of a silicon substrate, and an obtained individual chip 30 (semiconductor chip) is joined to the substrate 42 to form a semiconductor device.

The blade 20 used in the present embodiment has an edge 22 having a recessed shape in section. The section of the edge 22 of the blade 20 is taken by cutting the edge 22 by a plane containing the axis of rotation of the blade 20.

In the cutting step in the present embodiment, the semiconductor wafer 10 is half cut by using the blade 20 having the edge 22 recessed at a center in the widthwise direction so as to form the shape of a rectangular cut. That is, a cut 24 rectangular as viewed in section is provided in the blade 20.

In the semiconductor wafer 10 half cut with the blade 20, projections 60 are formed in uncut regions 12 in correspondence with the edge 22 in recessed form. The projections 60 are formed at centers of bottom surfaces 17 of groove portions 16 formed by half cutting so as to project on the other surface side of the semiconductor wafer 10.

In the irradiation step, modified layers 14 (not shown in FIGS. 5A to 5C) are formed at widthwise centers of the projections 60 by irradiation with laser light L from the front surface side or the other surface side of the semiconductor wafer 10. Therefore the semiconductor wafer 10 is broken at the widthwise centers of the projections 60. Each projection 60 is thereby divided into individual portions in an adjacent pair of two chip regions 11c. One chip region 11c is indicated by the broken line in FIG. 5B.

The breaking step can be performed by applying an external force to the semiconductor wafer 10 or by melting the semiconductor wafer 10 with laser light L after the step of irradiation with laser light L, as in the above-described first or second embodiment.

In the present embodiment, as shown in FIG. 5B, a dicing sheet 52 is adhered to the other surface side (lower side, as viewed in the figure) of the semiconductor wafer 10 after the cutting step and is pulled in an in-plane direction to break the semiconductor wafer 10 along the modified layers 14.

As shown in FIG. 5C, in the chip 30 obtained as an individual piece in the present embodiment, a width size WT on the front surface side is larger than a width size WB on the other surface side, and a step portion 34 is protrusively provided on a side wall surface 32 on the front surface side. A turned portion 36 is formed on the step portion 34 so as to extend toward the other surface side.

The turned portion 36 is formed by breaking the projection 60 projecting toward the other surface side at the widthwise center of the uncut region 12.

The chip 30 obtained as an individual piece has its other surface 19 and the side wall surface 32 joined to a substrate 42 by a mount resin 40.

When the chip 30 is joined to the substrate 42, the step portion 34 and the turned portion 36 of the chip 30 prevent the mount resin 40 from climbing to the top.

That is, the chip 30 has the step portion 34 formed in flange form in a direction intersecting the side wall surface 32, and has the turned portion 36 formed in fringing form on an outer edge of the step portion so as to extend toward the other surface 19 side. Therefore, even if the mount resin 40 climbing the side wall surface 32 reaches the step portion 34, it cannot reach the one surface 18 of the chip 30 around the turned portion 36.

As a result, any of metal terminals, e.g., bonding pads in the circuit pattern CP formed in the one surface 18 of the chip 30 is not embedded in the mount resin 40.

Thus, in the manufacturing method in the present embodiment, the cutting step is performed by using the blade 20 having the edge 22 in recessed form as viewed in section to form the turned portion 36 on the outer peripheral edge of the step portion 34 formed in flange form (in umbrella form) on the front surface side of the chip 30.

The mount resin 40 is thereby prevented from climbing, thereby enabling the entire one surface 18 of the chip 30 to be effectively used as a device region. Thus, the effect of improving the efficiency of use of portions of the semiconductor wafer 10 as a device region is achieved as well as the effect of improving the chip yield in the semiconductor wafer 10.

Various modifications of the present embodiment are also permitted.

Figure 6A:
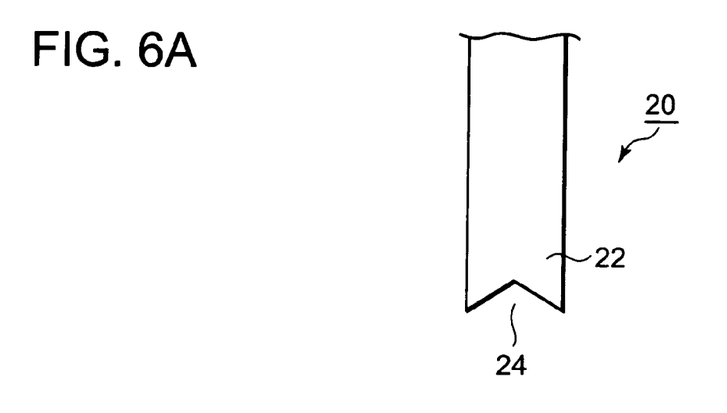
FIG. 6A shows in section the shape of an edge portion of a blade used in a first modified example of the third embodiment.
Figure 6B:
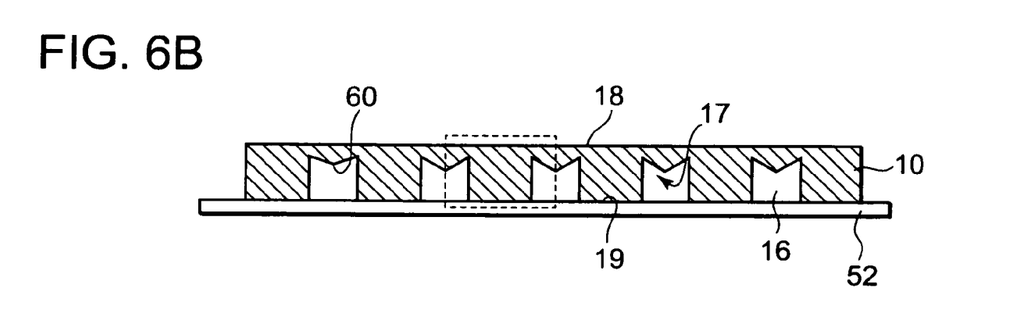
FIG. 6B is a sectional view of a semiconductor wafer half cut.
Figure 6C:
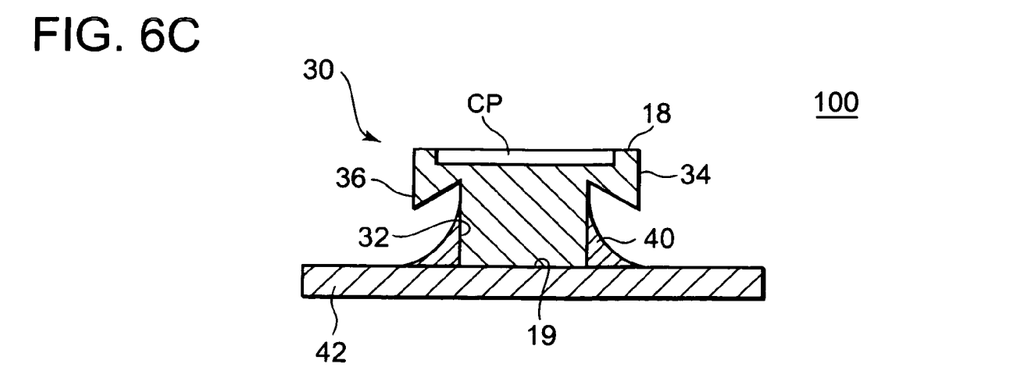
FIG. 6C is a sectional view of a device formed by joining a divided individual chip to a substrate.

FIG. 6A shows in section the shape of an edge portion of a blade 20 used in a first modified example of the present embodiment. FIG. 6B is a sectional view of a semiconductor wafer 10 when the semiconductor wafer 10 undergoes a cutting step to be half cut form the other surface side (from below as viewed in the figure) with the blade 20. FIG. 6C is a sectional view of a device 100 formed by joining to a substrate 42 a divided individual chip 30 obtained by performing an irradiation step and a breaking step.

The blade 20 used in the present embodiment has an edge 22 having a recessed shape in section. More specifically, the entire edge 22 is recessed in triangular form. That is, a cut 24 triangular as viewed in section is provided in the blade 20.

In the semiconductor wafer 10 half cut with the blade 20, bottom surfaces 17 of groove portions 16 project to the other surface side in triangular form, as shown in FIG. 6B.

As shown in FIG. 6C, in the chip 30 obtained by dividing the above-described semiconductor wafer 10 into pieces, a step portion 34 is protrusively provided on a side wall surface 32 on the one surface 18 side, and the side wall surface 32 and the step portion 34 intersect each other by forming an acute angle therebetween. A turned portion 36 in sloping form is formed on the lower surface side of the step portion 34 so as to be lowered with increase in distance from the side wall surface 32.

Even if the mount resin 40 climbs the side wall surface 32 when the chip 30 is joined to the substrate 42, the step portion 34 projecting from the side wall surface 32 toward the other surface side at an acute angle stops the mount resin 40 from climbing. Thus, the mount resin 40 does not reach the one surface 18 of the chip 30.

Figure 7A:
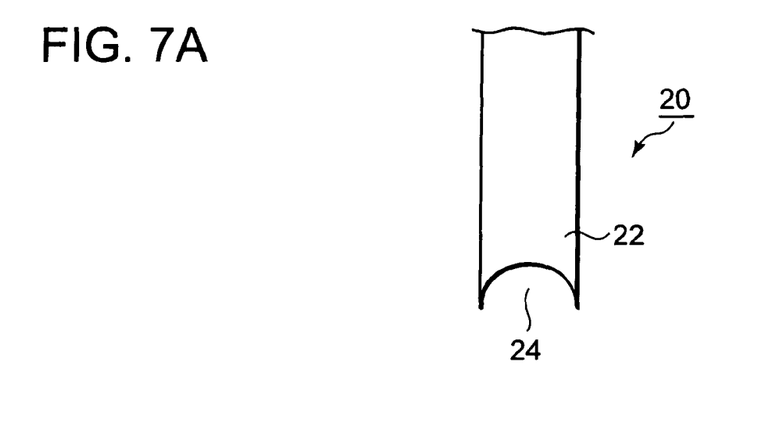
FIG. 7A shows in section the shape of an edge portion of a blade used in a second modified example of the third embodiment.
Figure 7B:
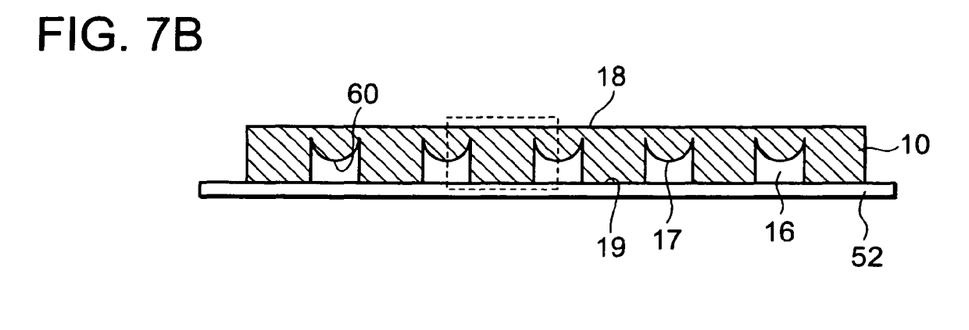
FIG. 7B is a sectional view of a semiconductor wafer half cut.
Figure 7C:
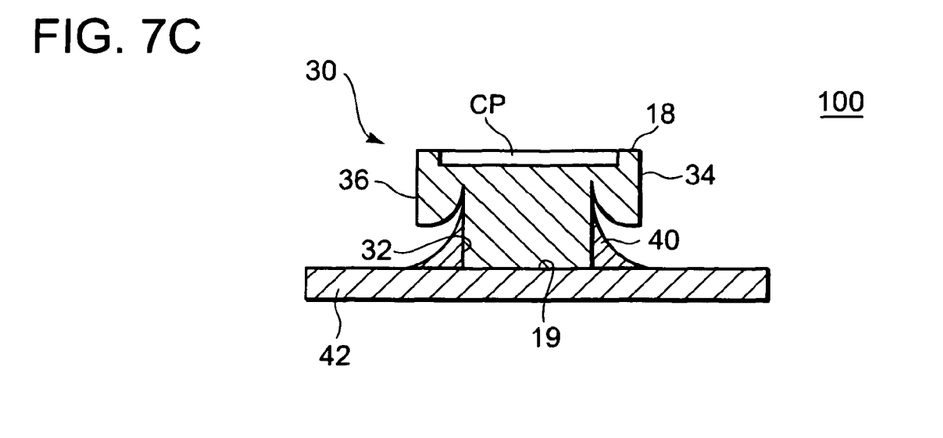
FIG. 7C is a sectional view of a device formed by joining a divided individual chip to a substrate.

FIG. 7A shows in section the shape of an edge portion of a blade 20 used in a second modified example of the present embodiment. FIG. 7B is a sectional view of a semiconductor wafer 10 when the semiconductor wafer 10 undergoes a cutting step to be half cut form the other surface side (from below as viewed in the figure) with the blade 20. FIG. 7C is a sectional view of a device 100 formed by joining to a substrate 42 a divided individual chip 30 obtained by performing an irradiation step and a breaking step.

The blade 20 used in the present embodiment has an edge 22 having a recessed shape in section. More specifically, the entire edge 22 is recessed in circular (semicircular) form. That is, a cut 24 semicircular as viewed in section is provided in the blade 20.

In the semiconductor wafer 10 half cut with the blade 20, bottom surfaces 17 of groove portions 16 project to the other surface side in semicircular form, as shown in FIG. 7B.

As shown in FIG. 7C, in the chip 30 obtained by dividing the above-described semiconductor wafer 10 into pieces, a step portion 34 in quarter circular-arc form is protrusively provided on a side wall surface 32 on the one surface 18 side, and the side wall surface 32 and the step portion 34 intersect each other by forming an acute angle therebetween.

Even if the mount resin 40 climbs the side wall surface 32, the step portion 34 projecting from the side wall surface 32 toward the other surface side at an acute angle stops the mount resin 40 from climbing, as does that in the first modified example. Thus, the mount resin 40 does not reach the one surface 18 of the chip 30.

What is claimed is:

1. A method for manufacturing a semiconductor chip by dividing a semiconductor wafer having a plurality of circuit patterns formed on one surface into pieces, said method comprising:
    forming a groove in a boundary region between the circuit patterns from an other surface of the semiconductor wafer by using a blade;
    forming a modified layer in the boundary region between the circuit patterns by laser irradiation from the one or the other surface of the semiconductor wafer; and
    dividing the semiconductor wafer into pieces by breaking the modified layer,
    wherein the modified layer is formed between a bottom surface of the groove and the one surface of the semiconductor wafer, and a width of the modified layer is smaller than a width of the groove,
    wherein the circuit patterns include an area that comprises a film with a dielectric constant that is lower than a dielectric constant of $SiO_2$, and
    wherein, in a plan view, the area of the circuit patterns overlaps with the bottom surface of the groove.

2. The method for manufacturing a semiconductor chip according to claim 1, wherein the circuit patterns are formed between the bottom surface of the groove and the one surface of the semiconductor wafer.

3. The method for manufacturing a semiconductor chip according to claim 1, wherein said forming the groove from the other surface of the semiconductor wafer is carried out to, at least, an interface between the substrate and a multi-layer interconnect structure.

4. The method for manufacturing a semiconductor chip according to claim 3, wherein a thickness of an uncut region of the semiconductor wafer is 20 to 200 µm.

5. The method for manufacturing a semiconductor chip according to claim 1, wherein said dividing the semiconductor wafer into pieces is performed on the semiconductor wafer having the groove and the modified layer formed in advance.

6. The method for manufacturing a semiconductor chip according to claim 1, wherein the boundary region between the circuit patterns is molten by laser irradiation to perform said dividing the semiconductor wafer into pieces together with forming the modified layer.

7. The method for manufacturing a semiconductor chip according to claim 1, wherein the laser irradiation is performed from the other surface of the semiconductor wafer.

8. The method for manufacturing a semiconductor chip according to claim 1, wherein the laser irradiation is performed from the one surface of the semiconductor wafer.

9. The method for manufacturing a semiconductor chip according to claim 1, wherein an edge of the blade has a recessed shape in section.

10. The method for manufacturing a semiconductor chip according to claim 1, wherein the area of the circuit patterns is formed between the bottom surface of the groove and the one surface of the semiconductor wafer.

11. The method for manufacturing a semiconductor chip according to claim 1, wherein the bottom surface of the groove abuts the semiconductor wafer.

12. The method for manufacturing a semiconductor chip according to claim 1, wherein the semiconductor wafer extends between the modified layer and the bottom surface of the groove.

13. The method for manufacturing a semiconductor chip according to claim 1, wherein an upper surface of the modified layer is located in a predetermined distance from the bottom surface of the groove.

* * * * *